United States Patent [19]

Sobhani

[11] Patent Number: 5,288,235
[45] Date of Patent: Feb. 22, 1994

[54] ELECTRICAL INTERCONNECTS HAVING A SUPPORTED BULGE CONFIGURATION
[75] Inventor: Mohi Sobhani, Encino, Calif.
[73] Assignee: Hughes Aircraft Company, Los Angeles, Calif.
[21] Appl. No.: 989,612
[22] Filed: Dec. 14, 1992
[51] Int. Cl.⁵ .............................................. H01R 9/09
[52] U.S. Cl. ...................................... 439/67; 29/846; 174/254; 439/69
[58] Field of Search ................. 439/67, 77, 493, 69; 29/846, 884, 882, 830; 174/254

[56]  References Cited
U.S. PATENT DOCUMENTS

| | | | |
|---|---|---|---|
| 4,116,517 | 9/1978 | Selvin et al. | 439/67 |
| 4,125,310 | 11/1978 | Reardon, II | 439/67 |
| 4,403,272 | 9/1983 | Larson et al. | 439/67 |
| 4,453,795 | 6/1984 | Moulin | 439/67 |
| 4,891,014 | 1/1990 | Simpson | 439/67 |
| 5,097,101 | 3/1992 | Trobough | 29/846 |
| 5,147,208 | 9/1992 | Bachler | 439/67 |
| 5,158,466 | 10/1992 | Schreiber | 439/67 |
| 5,161,403 | 11/1992 | Kitchens | 29/846 |
| 5,213,511 | 5/1993 | Sobhani | 439/67 |

Primary Examiner—Neil Abrams
Attorney, Agent, or Firm—M. E. Lachman; M. W. Sales; W. K. Denson-Low

[57] ABSTRACT

Electrical interconnects, contained in a supported bulge (42, 90) which extends substantially across a circuit or flexible cable (24, 92) in a continuous ridge pattern, are formed in both one or more of electrical conductors (32, 94) in the circuit or flexible cable and in any insulation (34, 98) underlying and adjacent to the conductors at the sites of the interconnects. The bulges may be placed individually in each conductor, or traverse the circuit or cable in a straight, curved, segmented or other broken or unbroken meandering path as a V-shaped or hollow shaped fold, wrinkle or crease in both the conductors and any insulation underlying the conductors at the sites of the interconnects. Supports (56, 108) for the bulges are so composed as to be physically, electrically and chemically compatible with their surrounding materials. Such interconnects are employable in circuits or flexible cables whose line widths and spacings are 3 mil (0.0762 mm) or less in dimension.

19 Claims, 3 Drawing Sheets

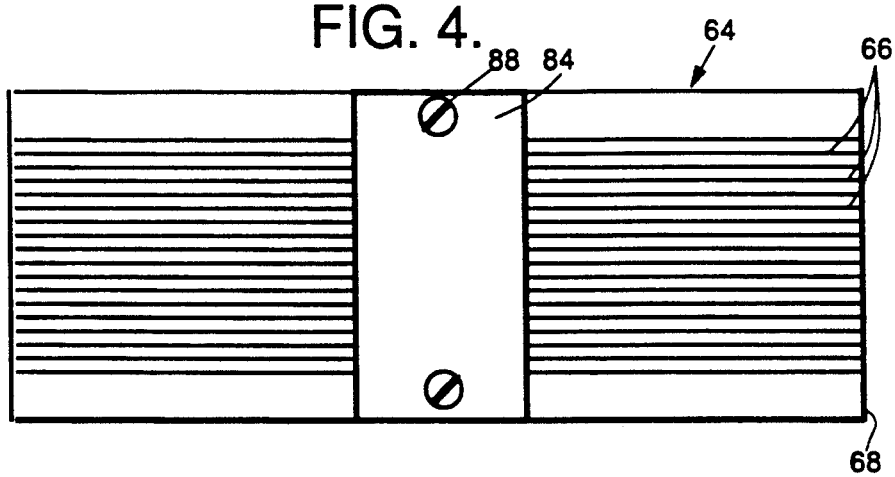
FIG. 4.
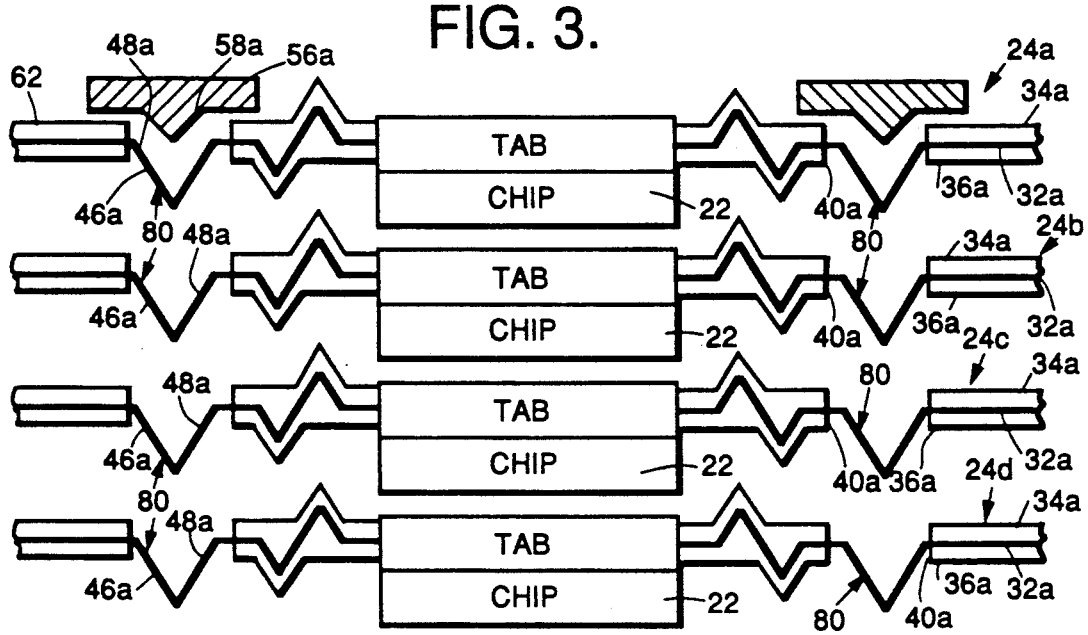
FIG. 3.
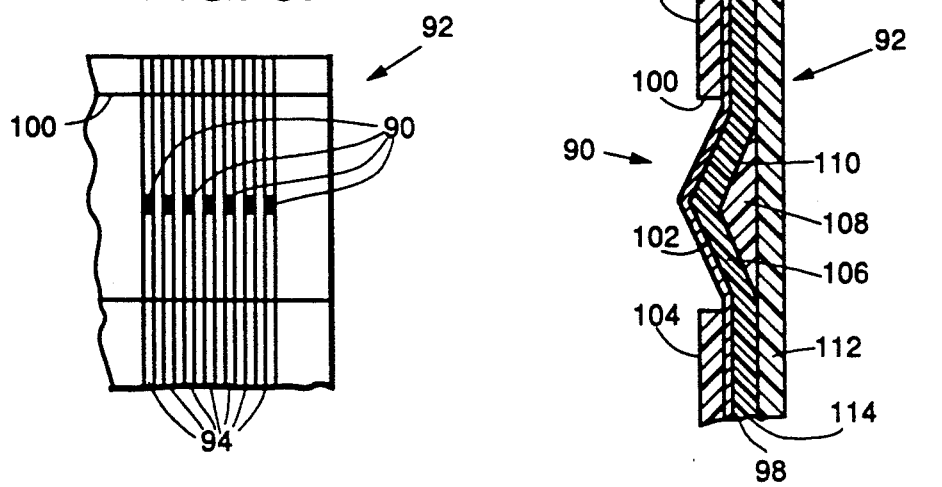
FIG. 6.
FIG. 7.

ELECTRICAL INTERCONNECTS HAVING A SUPPORTED BULGE CONFIGURATION

BACKGROUND OF THE INVENTION

1. Field of the Invention

The present invention relates to interconnects or contacts for conductors in a flat electrical circuit and, in particular, to such interconnects which have a pointed, serial or continuous supported bulge configuration, such as one or more upsets, e.g. V-shaped and hollow shaped, wrinkles, folds and creases, in both one or more of the conductors in the circuit and any insulation underlying the conductors at the sites of the interconnects.

2. Description of Related Art and Other Considerations

The interconnection of the electronic components, especially high density electronic components and printed wiring boards, presents recurring problems for which multitudes of solutions have been presented. Conventionally, micro-connectors, because of their small sizes, require soldering or other very expensive techniques. In particular, most connectors cannot handle a 3 mil to 5 mil (0.0762 mm to 0.1270 mm) or smaller line width and spacing in an efficient manner.

Accordingly, many conventional interconnection systems utilize pads or electrically conductive dots as a means of providing the interconnection, such as is disclosed in U.S. Pat. Nos. 4,125,310 and 4,453,795. These patents describe a plurality of generally resilient metallic raised projections. In the latter patent, a resilient backup mechanism is used to avoid overstressing and squashing of the resilient projections or contacts beyond their elastic limit, which overstressing precludes repeated mating and unmating of connectors incorporating such projections. While these terminations otherwise effectively and reliably interconnect mating circuits, their manufacture can be difficult, time consuming and costly. Furthermore, the manufacturing process for forming such bumps is limited to a size of about 2 mil (0.0508 mm) in diameter.

In addition, such bumps require proper support, without placing them at hazard to delamination due to outgassing from support materials during or after production or to inattention to thermal matching with its surrounding materials, or to possible electrical or chemical interaction with the surrounding materials.

SUMMARY OF THE INVENTION

These and other problems are solved by the present invention, which comprises an electrical connector for a flat cable or circuit having contacts or interconnects formed as a bulge arrangement or configuration. These bulge-type contacts or interconnects are shaped to provide a pointed, serial or continuous bulge configuration, such as one or more upsets, wrinkles, folds and creases, e.g., V-shaped and hollow shaped, both in one or more of conductors in the circuit and in any insulation underlying the conductors. The shape of the bulge configuration is maintained by a support, which also is selected to match physically and chemically with materials surrounding it.

More specifically, the bulge configurations result from so forming the cable as to provide one or more bulges in the circuit having concave and convex portions configured as single upsets, or a series of single upsets, or a linear bulge, e.g., having a V-shaped appearance, or a linear bulge. The support is shaped in accordance with the bulge into which it fits. Thus, it may comprise a dielectric resin for fitting into the pointed upsets or an extending bar with a V-shaped part, which respectively fits into the bulge concave portions or portion. A backing may be applied to the underside of the cable under the single upset, or the bar itself may be affixed to the underside of the circuit by an adhesive or secured into a mating bar on the upper side of the circuit.

Accordingly, the bulge configuration may comprise a series of upsets or a linear or curved wrinkle, fold or crease extending in a pattern across at least some of the conductors and the underlying dielectric circuit material if only one side of the conductors is exposed, although the conductor may be exposed on both sides to enable, for example, a plurality of the circuits to be stacked together and their bulges to interfit and electrically interconnect with adjacent bulges. The pattern may extend across the width of the circuit in any desired fashion, such as at right angles, diagonally, undulating, e.g., as a "V", curved, or arced.

Several advantages are derived from the present invention. Line widths and spacing between lines of less than 3 mil (0.0762 mm), e.g., 1 mil (0.0254 mm) or less, are obtainable so that the cable may be connected to a printed wiring board or a flexprint circuit, without the need to utilize other connectors, solder or welding. The resulting interconnection scheme provides for a low weight, low volume and low profile interconnection. The cost of manufacturing such bump configurations is much lower as related to those of prior connection systems.

Other aims and advantages, as well as a more complete understanding of the present invention, will appear from the following explanation of exemplary embodiments and the accompanying drawings thereof.

BRIEF DESCRIPTION OF THE DRAWINGS

FIG. 3 illustrates a further embodiment for interconnecting a stack of chips and their flexprint circuits, such as shown in FIGS. 1 and 2;

FIG. 4 is a top view of a flat cable arrangement;

FIG. 6 is a top view of a flexible circuit with individual bulge configurations on conductors therein;

FIG. 7 is a cross-sectional view of one of the bulge configurations, such as depicted in FIG. 6;

DETAILED DESCRIPTION OF THE PREFERRED EMBODIMENTS

Figure 1:
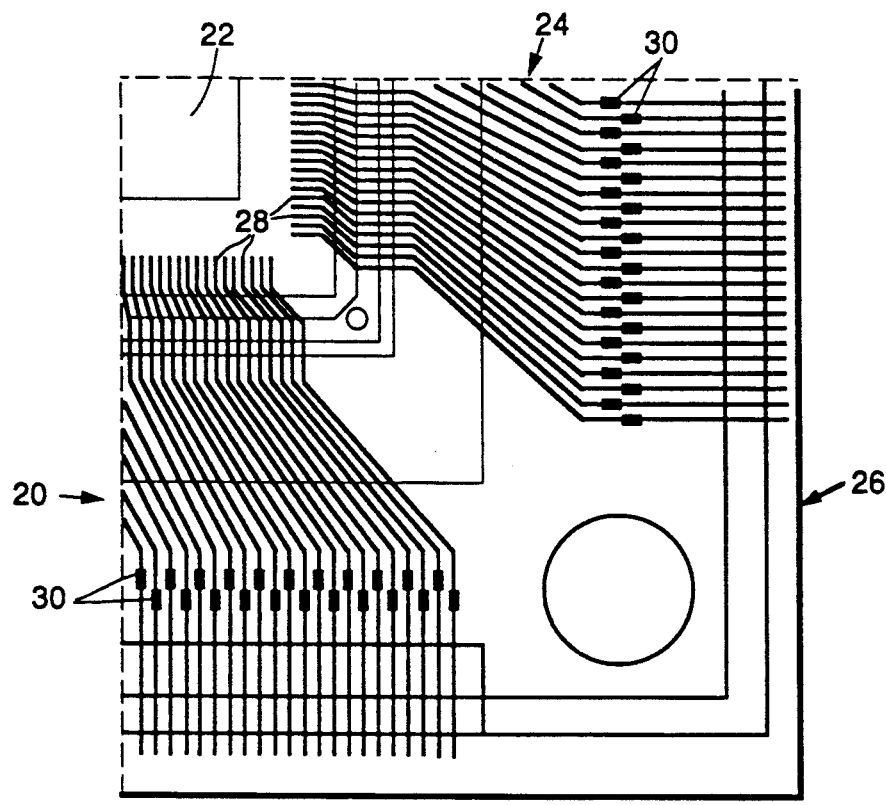
FIG. 1 illustrates a corner of a chip and multiple leaded flat circuit, such as a flexprint circuit, extending therefrom with its contacts having the bulge configuration of the present invention.

FIG. 1 illustrates a corner of an electronic assembly 20 comprising a chip 22, a flexprint circuit 24 and supporting hardware 26. Flexprint circuit 24 includes a plurality of fine lines, leads or conductors 28 which are electrically connected to the chip and extend upwardly to electrical connecting points 30. The assembly thus far described is of conventional construction, except that connecting points 30 and their supports are configured in accordance with the present invention.

Figure 2:
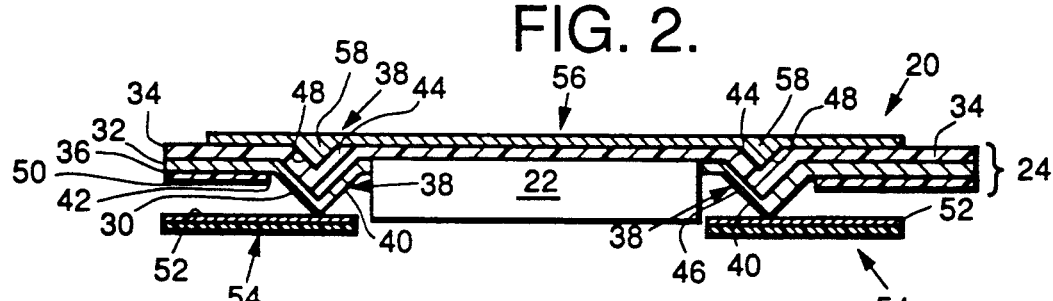
FIG. 2 is a side view in partial cross-section of an arrangement, such as is illustrated in FIG. 1.

As shown in FIG. 2, conductor 32, which is illustrative of all conductors 28 of FIG. 1 in flexprint circuit 24, is imbedded within upper and lower layers 34 and 36 of dielectric material, such as of polyimide plastic. A supported bulge configuration 38, comprising individual bulges or upsets, is formed at sites 40 on conductors 32 where contacts are desired. These sites are produced by removal of plastic insulation from lower plastic layer 36 to provide openings 42 therein. In the present invention, bulge configurations 38 are provided in both conductors 28 or 32 and contiguous portions 44 of upper plastic layer 34. As shown, bulge configurations 38 are V-shaped, having a convex portion 46 and a concave portion 48. The concave portion is of sufficient height that it extends beyond the smooth surface, denoted by indicium 50, of flexprint circuit 24. This extension of convex portion 46 permits the exposed portion of conductor 28 or 32 to contact a mating conductor 52 on another article 54, such as a flexprint, printed wiring board, and a cable.

A support 56, having V-shaped protuberances 58, fits within concave portions 48 of flexprint 24, to insure contact between convex portions 46 and mating conductors 52. Support 56 may be formed of any rigid material, and may comprise a metal, if the metal is insulated from conductors 28, or a rigid dielectric material. It is important that the material of support 56 also be chemically compatible with the materials constituting flexprint circuit.

The scheme shown with respect to FIG. 2 for a single chip and flexprint circuit may be utilized for assembling a plurality of chips and flexprint circuits into a stack, as shown in FIG. 3. In this embodiment, the various elements are substantially the same as that shown in FIG. 2 and, therefore, are designated with the same numerals, but differentiated by the addition of the letters "a" through "d" after the numeral, in order to illustrate a plurality of flexprint circuits 24a, 24b, 24c and 24d, each having an upper plastic film 34a and a lower plastic film 36a encapsulating electric conductors 32a. Because the intention in this embodiment is to electrically couple all four chips of FIG. 3 into a stack at interconnection sites 38a of the respective flexprint circuits, insulation material from both upper layers 34a and lower layers 36a are removed to provide respective openings 60 and 40a. The respective conductors 32a are bulged at sites 38a to provide V-shaped configurations, which define convex portions 46a and concave portions 48a. These V-shaped portions of conductor 32a are configured to be mutually interfittable, so that all intermediate concave and convex portions will contact. Support 56a having a V-shaped protuberance 58a is fitted into one of the concave portions at an outer face 62 of the stacked together circuits. The stacking of the V-shaped protuberances, in conjunction with support 56a, provides support for all protuberances.

Figure 5:
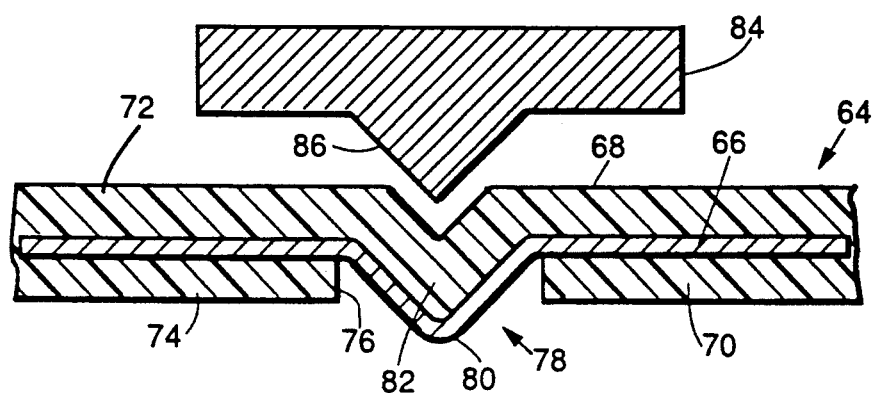
FIG. 5 depicts the cable arrangement, such as shown in FIG. 4, employing a bulge configuration having a linear or curved pattern.

Referring now to FIGS. 4 and 5, a flexible circuit or cable 64 comprises a plurality of conductors 66 encapsulated in plastic layers 68 and 70. Flexible cable 64 has smooth surfaces 72 and 74, with an opening 76 in surface 74 to define a site 78 for an interconnect. The interconnect is formed by displacing a portion 80 of conductor 66 and an underlying portion 82 of plastic layer 68. To insure that the interconnect formed by portions 80 and 82 maintain their shape, a support 84 having a V-shaped protuberance 86 is positioned on smooth surface 72 of cable 64 and placed within the concave portion of the interconnect. As illustrated in FIG. 4, support 84 is maintained in contact with flexible cable 64 by means of a cooperating plate secured to support 84 by fastening means such as screws 88 or to another plate in contact with surface 74 of plastic layer 70.

FIGS. 6 and 7 illustrate the bulge configuration as a sequence of pointed bulges or upsets 90 in a flat cable 92. Cable 92 includes a plurality of electrical conductors 94 encapsulated between upper and lower plastic layers 96 and 98. Material is removed from upper layer 96 to form an opening or window 100 for exposing an upper surface 102 of conductor 94, upper surface 102 being closest to the smooth surface, denoted by indicium 104, of flexible cable 92 and its upper layer 96. A pointed bulge is formed in each conductor 94 and its underlying plastic portion 106 of lower layer 98 sufficient to extend upper conductor surface 102 beyond smooth surface 104 of cable 92, in readiness for electrical contact with a mating contact. A support 108, comprising a small amount of rigid plastic, such as EPON 825 (a trademark of Shell Chemical Company for a diglycidyl ether of Bisphenol A), is positioned within the concave portion, designated by indicium 110, of each upset 90. This EPON 825 rigid plastic is a preferred material as meeting the several physical, electrical and chemical criteria for a support. A backup film 112 or other suitable layer is affixed to the surface, identified by indicium 114, of lower layer 98 of flexible cable 92, to assure that support 108 will remain in position.

Figure 8:
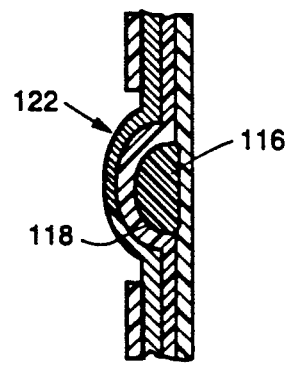
FIG. 8 is a an alternate arrangement of the bulge configuration.

In FIG. 8, which illustrates an alternate embodiment of the present invention, a support 116 is configured with a partial spherical surface 118 which interfits within a like spherical concave portion 120 of a bulge configuration 122.

Figure 9:
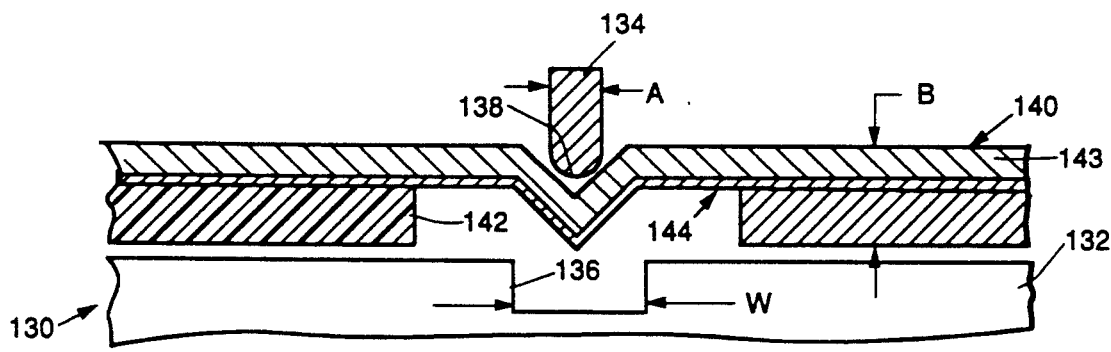
FIG. 9 depicts a method for forming one or more bulge configurations.

FIG. 9 illustrates a method for forming a bulge configuration, having a continuous ridge pattern, and utilizes a tool 130. Tool 130 comprises a die 132 and a blade 134, which are configured to form the desired continuous ridge pattern. Die 132 has an opening 136 of width W. Blade 134 has a thickness A and, preferably, terminates in a rounded end 138. A flat cable 140 having a thickness B, is positioned on die 132 and is so located that its opening 142 in a layer 143 of flat cable 140 defines a site 144 for the interconnect to be formed. The relationships of the dimensions of the tool and the cable is such that W=A+B+t, where -t is a tolerance, for example of 0.005 inches (0.127 mm), which is intended, in conjunction with rounded blade end 138, to form a proper V-shaped bulge without piercing or cutting into cable 140.

Figure 10A:
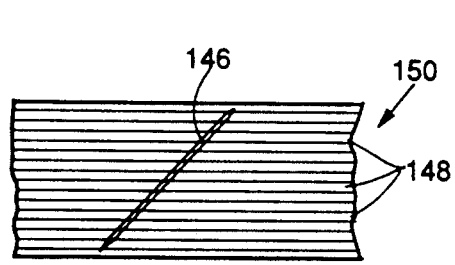
FIGS. 10a–10d illustrate patterns of bulge configurations extending across a cable.
Figure 10B:
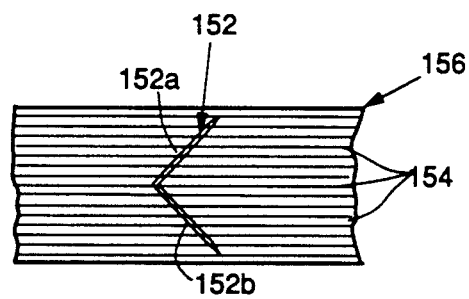
Figure 10C:
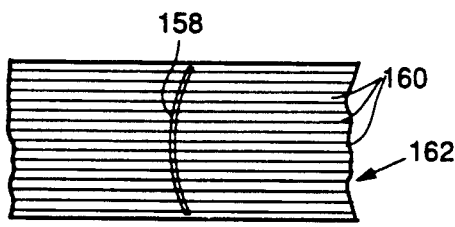
Figure 10D:
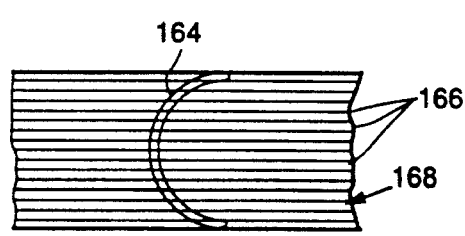

The bulge configurations of the present invention, as shown FIGS. 10a–10d, may take any suitable shape, whether pointed, serial or continuous, to form one or more upsets, wrinkles, folds and creases in both one or more of the conductors in the circuit or cable and in any insulation underlying the conductors at the sites of the interconnects. FIGS. 10a–10d exemplify several paths of linear and curved creases, folds or wrinkles which form a continuous ridge pattern. In FIG. 10a, bulge configuration 146 is patterned to take a path which extends linearly at an angle or diagonal to conductors 148 of a cable 150. In FIG. 10b, a bulge configuration 152 is patterned with a path which extends at a sequence of lines 152a and 152b across conductors 154 of a cable 156. In FIG. 10c, bulge configuration 158 has a pattern whose path gradually arcs across conductors 160 of a cable 162. FIG. 10d illustrates a bulge configuration 164 formed as a semi-circle traversing conductors 166 of a cable 168. All of the bulge configurations shown in FIGS. 10a-10d, are supported by like-patterned supports.

Although the invention has been described with respect to particular embodiments thereof, it should be realized that various changes and modifications may be made therein without departing from the scope of the invention.

What is claimed is:

1. An electrical connector, capable of establishing electrical contacts in flat circuits having line widths and spacing of less than 3 mil, comprising:
   a flat circuit having a smooth surface and including electrical conductors whose line widths and spacings may be less than 3 mil and which are encapsulated in dielectric material;
   said conductors having sites defining positions of electrical interconnects and being free from said dielectric material on at least that conductor surface portion which is closest to the smooth surface of said circuit; and
   a configuration, positioned at the sites, defining at least one ridge-like deformation extending across said circuit and both said conductors and any dielectric material contiguous thereto to define at least one ridged bulge in and across said conductors, for elevating those portions of said conductors and said dielectric material contiguous therewith and adjacent thereto at the sites above the smooth surface, and a support supporting said bulge being electrically, physically and chemically compatible with its surrounding materials.

2. An electrical connector comprising:
   at least two stacked together flat circuits, each having a smooth surface and including electrical conductors encapsulated in dielectric material and which have sites defining positions of electrical interconnects that are free from said dielectric material on at least that conductor surface which is adjacent to a stacked one of said circuits; and
   like configurations in each of said circuits, each of said configurations being positioned at the sites and defining at least one bulge in said conductors, for elevating those portions of said conductors at the sites above the smooth surface, said bulge configurations having interfittable concave and convex portions, to enable said conductors which are free from said dielectric material on both sides thereof and said bulge configurations therein in each of said circuits to interfit in electrical contact with one another when said circuits are stacked together; and
   a support which is electrically physically and chemically compatible with its surrounding materials and which is fittable into one of said concave portions at an outer face of said stacked together circuits, for supporting said interfitted bulge configurations.

3. An electrical connector according to claim 2 in which said respective bulge configurations extend in like patterns across said respective conductors.

4. An electrical connector capable of establishing electrical contacts in flat circuits whose electrical lines have widths and spacings therebetween of 3 mil and less in dimension, comprising:
   a flat circuit including electric conductors encapsulated in dielectric material and having a smooth surface, said conductors having sites defining positions of electrical interconnects and being free from said dielectric material on at least that conductor surface portion which is closest to the smooth surface of said circuit; and
   a supported ridge-like bulge arrangement which extends at least substantially across said circuit and is positioned at the sites in both said conductors and any of said dielectric material underlying said conductors, and which includes ridge-like deformations for elevating those portions of said conductors at the sites above the smooth surface.

5. An electrical connector according to claim 4 further comprising a substantially inelastic support physically and chemically compatible with its surrounding materials and disposed in electrical insulation from said conductors and in said bulges for support thereof.

6. An electrical connector according to claim 5 which:
   said bulge configuration comprises a plurality of bulges having concave and convex portions; and
   said support comprises portions thereof placed in said concave portions.

7. An electrical connector according to claim 6 further comprising a backing on said substrate and said portions for support thereof.

8. An electrical connector according to claim 4 in which said bulge configuration comprises upsets in respective ones of said conductors and any of said underlying dielectric material.

9. An electrical connector according to claim 4 in which said bulge configuration comprises one of a wrinkle, V-shaped fold and crease continuously extending across at least some of said conductors and any of said underlying dielectric material.

10. An electrical connector according to claim 4 in which said bulge configuration extends in a continuous ridge pattern across said circuit and said conductors therein.

11. An electrical connector according to claim 10 in which said pattern extends linearly at an angle to said conductors.

12. An electrical connector according to claim 10 in which said pattern extends linearly and normally to said conductors.

13. An electrical connector according to claim 10 in which said pattern extends linearly and at a diagonal to said conductors.

14. An electrical connector according to claim 10 in which said pattern extends as a sequence of lines angularly disposed to one another and to said conductors.

15. An electrical connector according to claim 10 in which said pattern extends in a curved path across said conductors.

16. A method for providing electrical interconnects in a flat electrical circuit having a substantially uniformly smooth surface and electrical conductors which are sizable to 3 mil and less line width and spacing and are encapsulated in dielectric material, in which the conductors have sites defining the positions of the electrical interconnects and being free from the dielectric material on at least that conductor surface portion which is closest to the smooth surface of the circuit, comprising the step of forming supported deformations which extend substantially continuously across the circuit and in both the conductors and any dielectric material contiguous thereto for defining ridged bulges in the smooth surface at and adjacent to the sites in the conductors and any underlying and adjacent dielectric material for elevating those portions of the conductors, which are free from dielectric material, at the sites above the smooth surface.

17. A method for providing electrical interconnects in at least two flat electrical circuits, each having electrical conductors encapsulated in dielectric material and a substantially uniformly smooth surface, in which the conductors have sites defining the positions of the electrical interconnects and being free from the dielectric material on at least that conductor surface portion which is closest to the smooth surface of its circuit and the circuit adjacent thereto, comprising the steps of:
  forming supported bulges in the smooth surface at the sites in the conductors and any underlying dielectric material for elevating those portions of the conductors, which are free from dielectric material, at the sites above the smooth surface;
  configuring the bulges of each of the circuits with interfittable concave and convex shaped portions for enabling the bulges of each of the circuits to interfit in electrical contact with one another of the bulges;
  stacking the circuits together in such a manner as to interfit the respective bulge portions thereof, thereby forming a stacked circuit arrangement; and
  fitting a support into the concave portions at an outer face of the arrangement for supporting the interfitted portions of the bulges.

18. A method according to claim 16 in which said bulge forming step comprises the step of forming the bulges also in the dielectric material underlying the conductors.

19. A method according to claim 16 further comprising the step of configuring the bulges in a pattern which extends across said conductors and which consists of a group of paths selected from a path disposed linearly at an angle to the conductors, a path disposed linearly and normally to the conductors, a path disposed linearly and diagonally to the conductors, a path disposed as a plurality of lines being angularly disposed to one another and to the conductors, and a curved path traversing the conductors.

* * * * *